US012748519B2

(12) United States Patent
Zeng

(10) Patent No.: US 12,748,519 B2
(45) Date of Patent: Sep. 29, 2026

(54) DISPLAY PANEL AND DISPLAY APPARATUS

(71) Applicant: Wuhan Tianma Microelectronics Co., Ltd., Wuhan (CN)

(72) Inventor: Fangxinyu Zeng, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 0 days.

(21) Appl. No.: 19/240,952

(22) Filed: Jun. 17, 2025

(65) Prior Publication Data

US 2025/0306724 A1 Oct. 2, 2025

(30) Foreign Application Priority Data

Feb. 28, 2025 (CN) ......................... 202510237959.5

(51) Int. Cl.
*G06F 3/044* (2006.01)
*H10H 29/37* (2025.01)
*H10H 29/49* (2025.01)

(52) U.S. Cl.
CPC ........... *G06F 3/0446* (2019.05); *H10H 29/37* (2025.01); *H10H 29/49* (2025.01); *G06F 2203/04107* (2013.01)

(58) Field of Classification Search
CPC . G06F 3/041–0446; G06F 2203/04107; G06F 3/0412; G06F 3/04164; G06F 3/0443; H10H 29/37; H10H 29/49; H10K 59/40; G09G 3/30–3291
See application file for complete search history.

(56) References Cited

U.S. PATENT DOCUMENTS

| | | | | |
|---|---|---|---|---|
| 10,474,295 B2 * | 11/2019 | Kim | G06F 3/0412 |
| 12,422,965 B1 * | 9/2025 | Hsu | G06F 3/0446 |
| 2011/0090420 A1 * | 4/2011 | Kim | G06F 3/042 257/E31.127 |
| 2012/0038595 A1 * | 2/2012 | Park | G06F 3/0443 29/622 |
| 2019/0384445 A1 * | 12/2019 | Huang | G06F 3/0412 |
| 2021/0083013 A1 * | 3/2021 | Bang | G06F 3/0412 |
| 2021/0088824 A1 * | 3/2021 | Tsai | G02F 1/133614 |
| 2021/0200383 A1 * | 7/2021 | Hsiao | C23F 1/44 |
| 2022/0262866 A1 * | 8/2022 | Kim | G06F 3/0412 |
| 2023/0038366 A1 * | 2/2023 | Lee | H10K 50/858 |
| 2023/0110873 A1 * | 4/2023 | Crespi | G01D 5/24 |
| 2023/0337493 A1 * | 10/2023 | Gu | H10K 59/131 |

(Continued)

*Primary Examiner* — Amy Onyekaba

(74) *Attorney, Agent, or Firm* — Christensen O'Connor Johnson Kindness PLLC

(57) ABSTRACT

Provided are a display panel and a display apparatus. A display layer in the display panel is located at a side of the circuit layer away from the substrate. The display layer includes a pixel definition layer, first electrodes and second electrodes. The pixel definition layer has openings exposing the second electrodes. At least part of the first electrodes is located in the openings. The touch layer is located at a side of the display layer away from the substrate, and includes a touch trace. The touch trace overlaps with the pixel definition layer along a direction perpendicular to a plane of the substrate. The first shielding structure and the first electrode are located in a same layer. The first shielding structure at least partially overlaps the touch trace along the direction perpendicular to the plane of the substrate.

20 Claims, 19 Drawing Sheets

(56) References Cited

U.S. PATENT DOCUMENTS

| | | | | |
|---|---|---|---|---|
| 2024/0215329 | A1* | 6/2024 | Han | H10K 59/122 |
| 2024/0224701 | A1* | 7/2024 | Lee | G06F 3/0412 |
| 2024/0338096 | A1* | 10/2024 | Zheng | G06F 3/0418 |
| 2024/0357884 | A1* | 10/2024 | Kim | G06F 3/0412 |
| 2024/0370117 | A1* | 11/2024 | Zhang | G06F 3/04164 |
| 2024/0377914 | A1* | 11/2024 | Kim | G06F 3/0416 |
| 2025/0004334 | A1* | 1/2025 | Wu | G02F 1/134345 |
| 2025/0021199 | A1* | 1/2025 | Wen | G06F 3/0445 |
| 2025/0306700 | A1* | 10/2025 | Kim | G06F 3/04164 |

* cited by examiner

DISPLAY PANEL AND DISPLAY APPARATUS

CROSS-REFERENCE TO RELATED APPLICATIONS

The present application claims priority to Chinese Application No. 202510237959.5 with the application title of "DISPLAY PANEL AND DISPLAY APPARATUS", filed on Feb. 28, 2025, the content of which is incorporated herein by reference in its entirety.

TECHNICAL FIELD

The present disclosure relates to the field of display technologies, and in particular, to a display panel and a display apparatus.

BACKGROUND

At present, some electronic products with touch functionality can be used with a stylus. The stylus is mainly divided into active and passive types. A passive stylus mimics the touch effect of a finger, so the tip of the stylus is thicker. An active stylus, on the other hand, has a circuit board that can absorb and transform electrical currents. By interacting with the screen, the active stylus changes the current to function. Therefore, the tip of the active stylus does not need to be too thick to trigger a response. Moreover, the active stylus offers higher precision during use. In terms of the performance, the active stylus is superior to the passive stylus.

In practice, since the driving frequency of the display panel differs from that of the stylus, when the display panel and stylus operate simultaneously, signal interference occurs between the display panel and the stylus, resulting in signal delay relative to the display panel, thereby affecting the sensitivity of the stylus.

SUMMARY

An aspect of the present disclosure provides a display panel. The display panel includes: a substrate, and a circuit layer, a display layer, a touch layer and a first shielding structure that are located at a side of the substrate. The display layer is located at a side of the circuit layer away from the substrate. The display layer includes a pixel definition layer, first electrodes and second electrodes. The pixel definition layer includes openings exposing the second electrodes, and at least part of the first electrodes is located in the openings. The touch layer is located at a side of the display layer away from the substrate. The touch layer includes a touch trace, and the touch trace overlaps with the pixel definition layer along a direction perpendicular to a plane of the substrate. The first shielding structure and the first electrode are located in a same layer. The first shielding structure at least partially overlaps with the touch trace along the direction perpendicular to the plane of the substrate.

Another aspect of the present disclosure provides a display apparatus that includes a display panel. The display panel includes: a substrate, and a circuit layer, a display layer, a touch layer and a first shielding structure that are located at a side of the substrate. The display layer is located at a side of the circuit layer away from the substrate. The display layer includes a pixel definition layer, first electrodes and second electrodes. The pixel definition layer includes openings exposing the second electrodes, and at least part of the first electrodes is located in the openings. The touch layer is located at a side of the display layer away from the substrate. The touch layer includes a touch trace, and the touch trace overlaps with the pixel definition layer along a direction perpendicular to a plane of the substrate. The first shielding structure and the first electrode are located in a same layer. The first shielding structure at least partially overlaps with the touch trace along the direction perpendicular to the plane of the substrate.

BRIEF DESCRIPTION OF DRAWINGS

In order to better illustrate the technical solutions in the embodiments of the present disclosure or the related art, the drawings used in the description of the embodiments will be briefly illustrated as follows. It should be noted that, the drawings described below are merely some of, rather than all of the embodiments of the present disclosure. Based on these drawings, those skilled in the art can obtain other drawings.

DESCRIPTION OF EMBODIMENTS

In order to more clearly illustrate objectives, technical solutions, and advantages of embodiments of the present disclosure, the technical solutions in embodiments of the present disclosure are described in details with reference to the drawings. It should be noted that, the described embodiments are merely some but not all of the embodiments of the present disclosure. Based on the embodiments of the present disclosure, all other embodiments obtained by those ordinary skilled in the art shall fall within the protection scope of the present disclosure.

Terms used in the embodiments of the present disclosure are only for the purpose of describing specific embodiments, but not intended to limit the present disclosure. The terms "a/an", and "the/said" in a singular form in an embodiment of the present disclosure and the attached claims are also intended to include plural forms thereof, unless explicitly noted otherwise in the context.

Embodiments of the present disclosure provide a display panel and a display apparatus. A cathode in the display layer of the display panel adopts a graphical design. The first shielding structure is manufactured in a same layer as the cathode to shield circuit signals of the display panel without influencing the display, the signal interference between the display panel and the touch tool can be reduced in practice, thereby improving the sensitivity of the touch tool. Further, a second shielding structure is manufactured in a same layer as the anode in the display layer. The second shielding structure and the first shielding structure together play a role in signal shielding. Further, an embodiment of the present disclosure further design a shape and a power supply manner of the first shielding structure/the second shielding structure. The above is the main technical concept of the present disclosure, and the present disclosure is illustrated below by way of embodiments.

Figure 1:
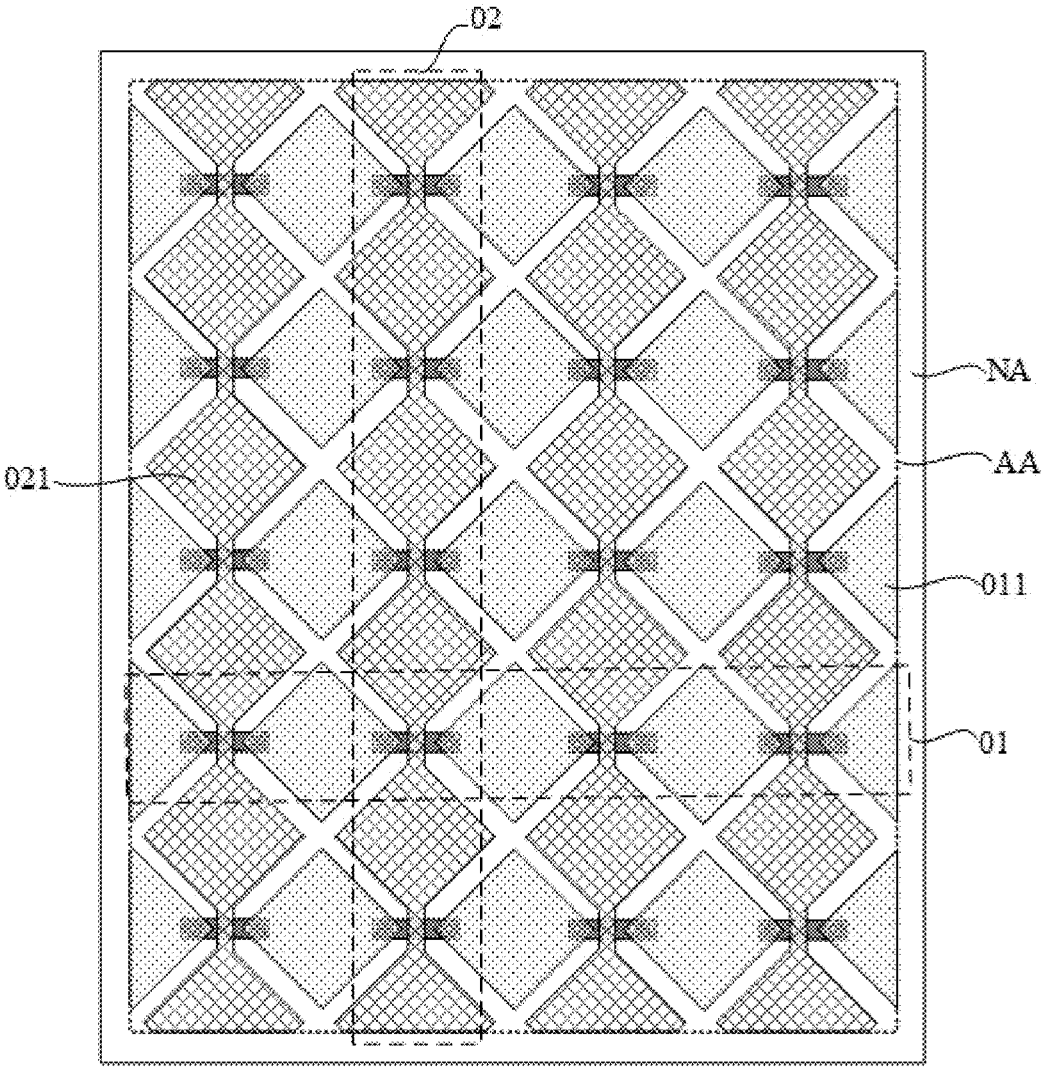
FIG. 1 is a schematic diagram of a display panel according to an embodiment of the present disclosure.
Figure 2:
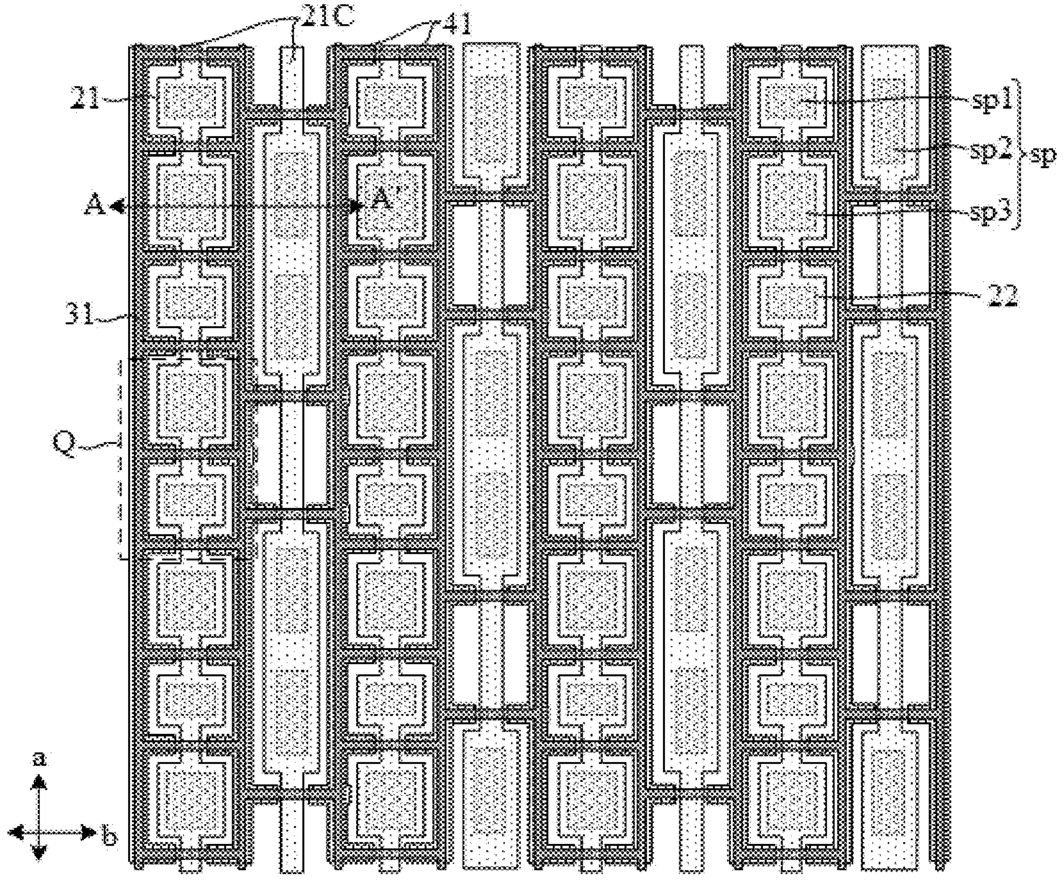
FIG. 2 is a partial schematic diagram of the display panel in FIG. 1 according to an embodiment of the present disclosure.
Figure 3:
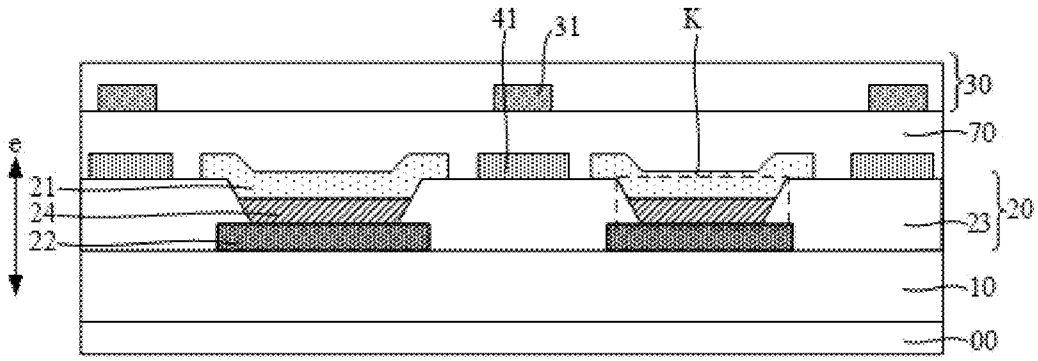
FIG. 3 is a cross-sectional view of FIG. 2 along line A-A' according to an embodiment of the present disclosure.

FIG. 1 is a schematic diagram of a display panel according to an embodiment of the present disclosure, FIG. 2 is a partial schematic diagram of the display panel in FIG. 1 according to an embodiment of the present disclosure, and FIG. 3 is a cross-sectional view of FIG. 2 along line A-A' according to an embodiment of the present disclosure.

As shown in FIG. 1, the display panel includes a display region AA and a non-display region NA. A first touch electrode 01 and a second touch electrode 02 intersecting with each other along an extending direction are disposed in the display region AA. The first touch electrode 01 includes a plurality of first electrode blocks 011. The second touch electrode 02 includes a plurality of second electrode blocks 021. The first touch electrode 01 cooperates with the second touch electrode 02 to implement the touch function of the display panel.

FIG. 2 illustrates a position of one electrode block in the display region AA, and the electrode block may be the first electrode block 011 or the second electrode block 021. As shown in FIG. 2, the display panel includes a plurality of sub-pixels sp. Touch traces 31 are arranged between the sub-pixels sp. The first touch electrode 01 and the second touch electrode 02 respectively include a plurality of touch traces 31, respectively. The sub-pixels sp includes first sub-pixels sp1, second sub-pixels sp2, and third sub-pixels sp3 with different colors. FIG. 2 shows a first electrode 21 and a second electrode 22 respectively included in each of the sub-pixels sp. A plurality of first electrodes 21 are connected to each other to form a common electrode 21C. In FIG. 2, the first sub-pixels sp1 and the third sub-pixels sp3 are alternately arranged in a first sub-pixel column along the first direction a. The plurality of second sub-pixels sp2 are arranged in a second sub-pixel column along the first direction a. The first sub-pixel column and the second sub-pixel column are alternately arranged along the second direction b. In an embodiment, the first sub-pixels sp1 are red sub-pixels, the second sub-pixels sp2 are blue sub-pixels, and the third sub-pixels sp3 are green sub-pixels. The arrangement of the sub-pixels sp in FIG. 2 is only schematically shown, and is not intended to limit the present disclosure. In addition, the shape of each sub-pixel sp in FIG. 2 is also illustrated by a rectangle.

Referring to FIG. 3, the display panel includes a substrate 00, a circuit layer 10, a display layer 20, a touch layer 30, and a first shielding structure 41. The circuit layer 10, the display layer 20, the touch layer 30, and the first shielding structure 41 are located at a side of the substrate 00. The circuit layer 10 includes a pixel circuit configured to drive the sub-pixels sp to emit light. The pixel circuit can be any type of pixel circuit in the related art. The display layer 20 is located at a side of the circuit layer 10 away from the substrate 00. The display layer 20 includes a pixel definition layer 23, a plurality of first electrodes 21 and a plurality of second electrodes 22. The pixel definition layer 23 has a plurality of openings K. The openings K expose the second electrode 22. At least part of the first electrode 21 are located within the opening K. That is, the first electrodes 21 are located at a side of the second electrodes 22 away from the substrate 00. The opening K is a sub-pixel opening. One sub-pixel sp corresponds to one opening K. The sub-pixel sp includes a first electrode 21, a light-emitting layer 24 and a second electrode 22 that are stacked. In an embodiment, the first electrode 21 is a cathode, and the second electrode 22 is an anode. After applying voltage to the first electrode 21 and the second electrode 22 respectively, the light-emitting material in the light-emitting layer 24 is excited to realize the light-emitting of the sub-pixels sp.

The touch layer 30 is located at a side of the display layer 20 away from the substrate 00. The touch layer 30 includes the first touch electrode 01 and the second touch electrode 02 as illustrated in FIG. 1. An encapsulation layer 70 is further disposed between the touch layer 30 and the display layer 20, and the encapsulation layer 70 is configured to block moisture and oxygen, thereby enhancing the operational lifetime of the sub-pixel SP. The touch layer 30 includes a touch line 31. The touch line 31 overlaps with the pixel definition layer 23 along a direction e perpendicular to a plane of the substrate 00.

In an embodiment of the present disclosure, the touch layer 30 can be at least configured for detecting a touch operation of a touch tool, such as a stylus. A battery and an electronic circuit are integrated in the stylus. The stylus communicates with an electronic device through Bluetooth or other wireless technologies, and the action and pressure of the tip of the stylus can be transmitted to the display panel. The stylus may also support advanced functions such as pressure sensing and tilt detection. The stylus provides an input signal (or a transmitting signal) to the display panel in practice. The touch layer 30 detects an externally input signal through electrostatic capacitance, and subsequently determines information such as a touch position and a touch action of the stylus according to the sensing signal. When the stylus is configured as an external input of the display panel, the stylus is driven at a preset frequency, and the driving frequency of the stylus is different from the driving frequency of the display panel.

In some embodiments, the touch layer 30 can also be configured to capacitively detect a touch operation of a user's finger. In some other embodiments, two types of electrodes are integrated in the touch layer 30. The first type of electrode includes a touch trace 31, and the electrode is configured to cooperate with the touch operation of the stylus. The second type of electrode is configured to cooperate with the touch operation of the finger.

In an embodiment of the present disclosure, the first shielding structure 41 and the first electrode 21 are disposed in a same layer. Along the direction e perpendicular to the plane of the substrate 00, the first shielding structure 41 at least partially overlaps with the touch trace 31. The first shielding structure 41 and the first electrode 21 are made from the same material. The first shielding structure 41 and the first electrode 21 may be manufactured in a same process and insulated from each other. In a conventional solution, the plurality of first electrodes 21 are connected to each other to form a common electrode covering the entire surface of the display region, while in the present disclosure, since the first shielding structure 41 is disposed in a same layer as the first electrodes 21, the common electrode 21C formed by the plurality of first electrodes 21 is a patterned structure.

In the display panel provided by an embodiment of the present disclosure, the first shielding structure 41 is manufactured in a same layer as the first electrode 21. The first shielding structure 41 is at least partially overlapped with the touch trace 31, so that the first shielding structure 41 can play a role in shielding signals between the touch trace 31 and the circuit layer 10. When an active touch tool (such as a stylus) is configured to control the display panel, the touch tool communicates and interacts with the touch trace 31, and the shielding effect of the first shielding structure 41 can reduce signal interference between the display panel and the touch tool, thereby enhancing the sensitivity of the touch tool, and thus improving sensitivity of the touch tool and improving users' experience.

Figure 4:
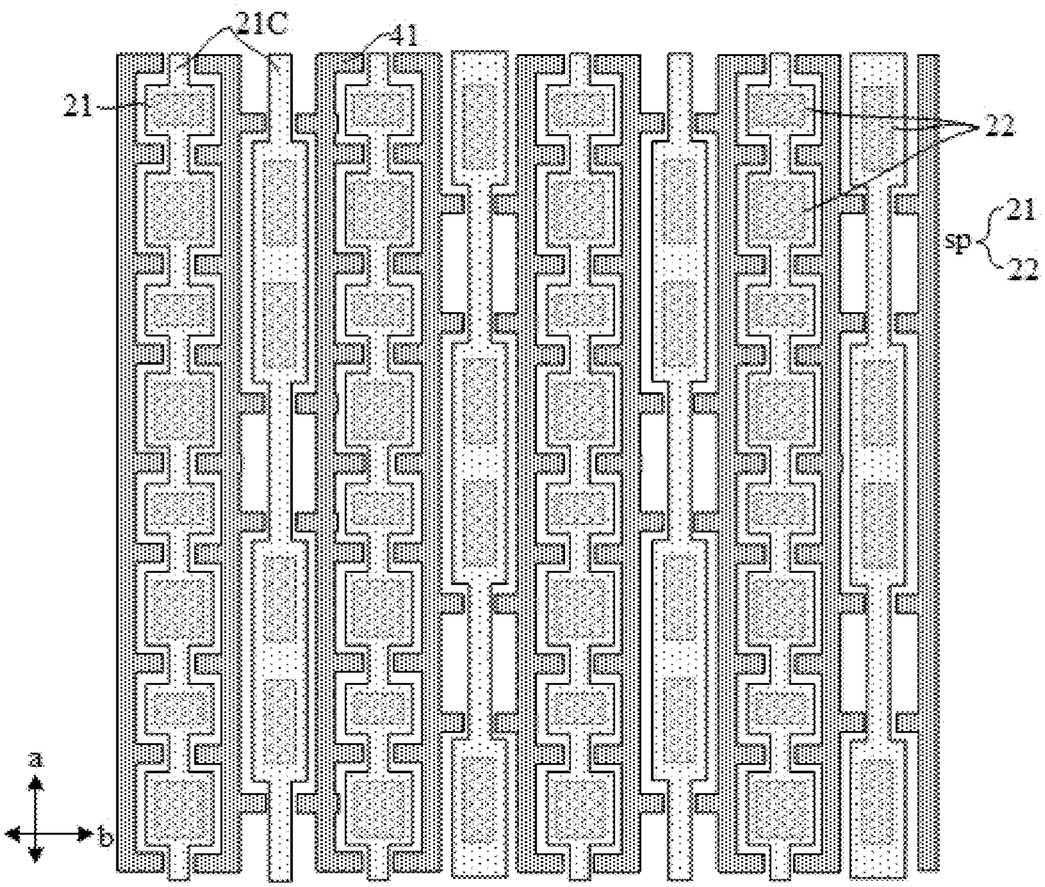
FIG. 4 is a schematic diagram of a display panel according to another embodiment of the present disclosure.

FIG. 4 is a schematic diagram of a display panel according to another embodiment of the present disclosure. In addition, FIG. 4 illustrates a film layer of the first electrode 21 in the embodiment of FIG. 2, and the second electrode 22 overlapping the first electrode 21 in each sub-pixel sp in the display panel. As shown in FIG. 4, at least two interconnected first electrodes 21 form a common electrode 21C. The common electrode 21C and the first shielding structure 41 respectively extend along a first direction a. The common electrode 21C and the first shielding structure 41 are alternately arranged along a second direction b. The first direction a and the second direction b are respectively parallel to the substrate 00. The first direction a intersects with the second direction b. In this embodiment, the common electrode 21C and the first shielding structure 41 are substantially elongated, and are arranged alternately. For example, a plurality of sub-pixels sp arranged along the first direction a form a sub-pixel column. One sub-pixel column is correspondingly provided with one common electrode 21C, and the first shielding structure 41 is disposed between adjacent sub-pixel columns. In this way, both the common electrode 21C and the first shielding structure 41 exhibit enhanced arrangement regularity, respectively. On one hand, the voltage uniformity on each common electrode 21C is facilitated, thereby improving the display uniformity. On the other hand, the touch trace 31 is usually arranged between the sub-pixels sp, and the regular arrangement of the first shielding structure 41 can overlap the first shielding structure 41 and the touch traces 31 at more positions, thereby improving the shielding effect of the first shielding structure 41.

Figure 5:
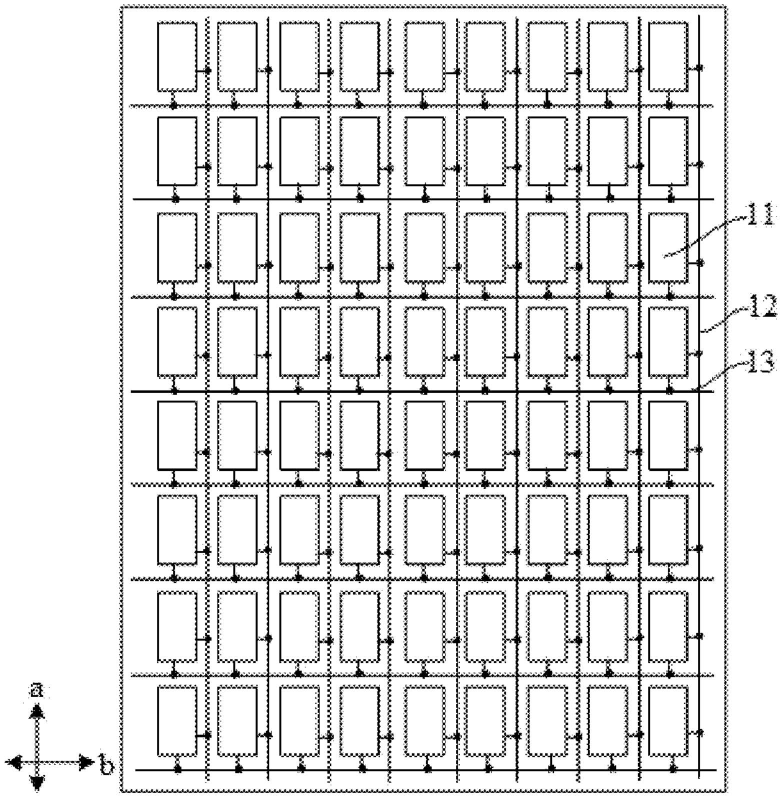
FIG. 5 is a schematic diagram of a display panel according to another embodiment of the present disclosure.

In some embodiments, FIG. 5 is a schematic diagram of a display panel according to another embodiment of the present disclosure. As shown in FIG. 5, the display panel includes a pixel circuits 11, data lines 12 and scan lines 13, and the pixel circuits 11 are arranged in an array. The pixel circuit 11, the data line 12 and the scan line 13 are located in the circuit layer 10. Taking the data line 12 extending along the first direction a and the scan line 13 extending along the second direction b as an example, one data line 12 is connected to a plurality of pixel circuits 11 arranged along the first direction a, and one scan line 13 is connected to a plurality of pixel circuits 11 arranged along the second direction b. The data line 12 is configured to provide a data signal to the pixel circuit 11. The scan line 13 is configured to provide a scan signal to the pixel circuit 11. The data line 12 and the scan line 13 jointly drive the pixel circuit 11 to work. Referring to FIG. 4, an extension direction of the common electrode 21C and the first shielding structure 41 is the same as an extension direction of the data line 12. The common electrode 21C and the first shielding structure 41 are located in the same layer, which is equivalent to patterning the film layer on the original whole surface. Extension directions of the common electrode 21C and the first shielding structure 41 are provide to be the same as an extension direction of the original signal line in the display panel, thereby making the shape and arrangement of the common electrode 21C more regular, being beneficial to the voltage uniformity on each common electrode 21C and thus improving the display uniformity. Moreover, the first shielding structure 41 can overlap with the touch traces 31 at more positions, thereby improving the shielding effect of the first shielding structure 41.

In another embodiment, the data line 12 extends along the second direction b, the scan line 13 extends along the first direction a, and the common electrode 21C and the first shielding structure 41 extend in the same direction as the scan line 13. The drawings are not illustrated here.

Figure 6:
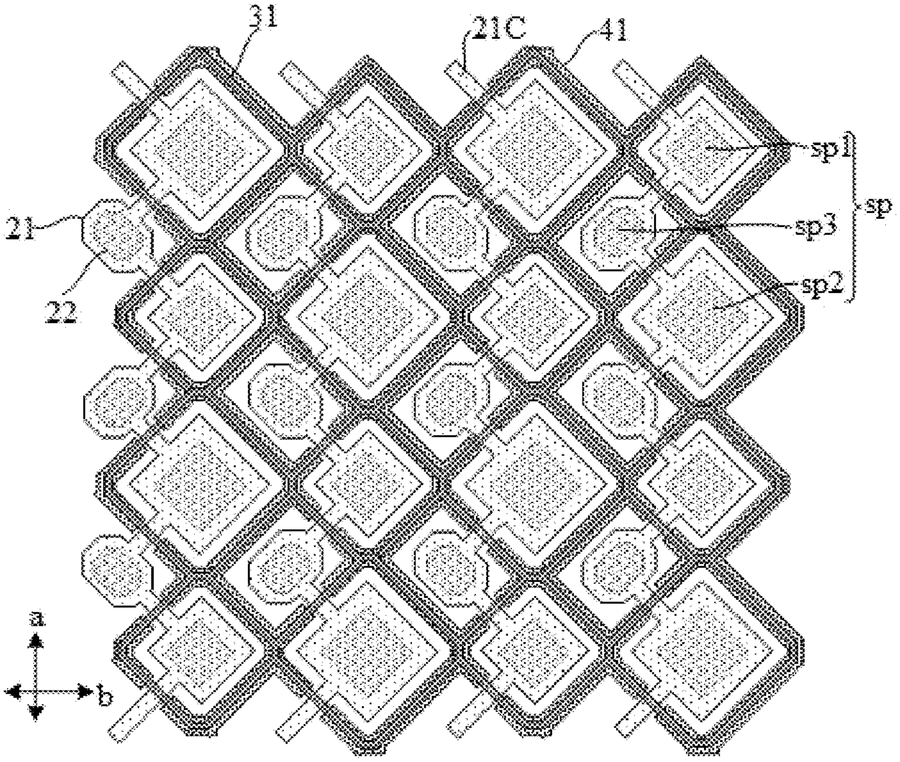
FIG. 6 is a partial schematic diagram of a display panel according to another embodiment of the present disclosure.

In some embodiments, FIG. 6 is a partial schematic diagram of a display panel according to another embodiment of the present disclosure. FIG. 6 illustrates a position of one electrode block in the display region AA, and the electrode block may be the first electrode block 011 or the second electrode block 021. FIG. 6 illustrates another pixel arrangement of the display panel, which may be a diamond arrangement or a diamond-like arrangement. The first sub-pixels sp1 and the second sub-pixels sp2 are alternately arranged along the first direction a into a first sub-pixel column. The plurality of third sub-pixels sp3 are arranged along the first direction a into a second sub-pixel column. The first sub-pixel column and the second sub-pixel column are alternately arranged along the second direction b. Sub-pixels in the first sub-pixel columns and sub-pixels in the second sub-pixel columns are misaligned along the second direction b.

Figure 7:
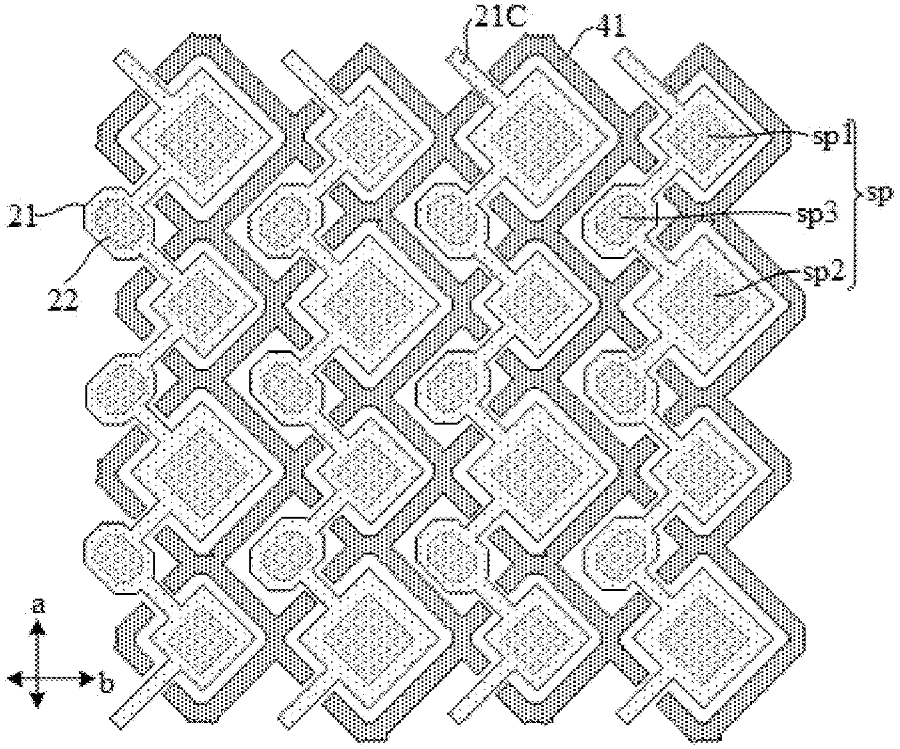
FIG. 7 is a partial schematic diagram of a display panel according to another embodiment of the present disclosure.

FIG. 7 is a partial schematic diagram of a display panel according to another embodiment of the present disclosure, and FIG. 7 is a schematic diagram of FIG. 6 with the touch trace 31 removed. Referring to FIG. 6 and FIG. 7, the plurality of first electrodes 21 in the first sub-pixel column and the second sub-pixel column are connected to each other to form the common electrode 21C. An extending direction of the common electrode 21C and the first shielding structure 41 is substantially the first direction a. The common electrode 21C and the first shielding structure 41 are alternately arranged along the second direction b.

The shapes of the common electrode 21C and the first shielding structure 41 in FIG. 4 and FIG. 7 are merely illustrative, and are not intended to limit the present disclosure. The shapes of the common electrode 21C and the first shielding structure 41 may be designed according to a specific pixel arrangement.

Figure 8A:
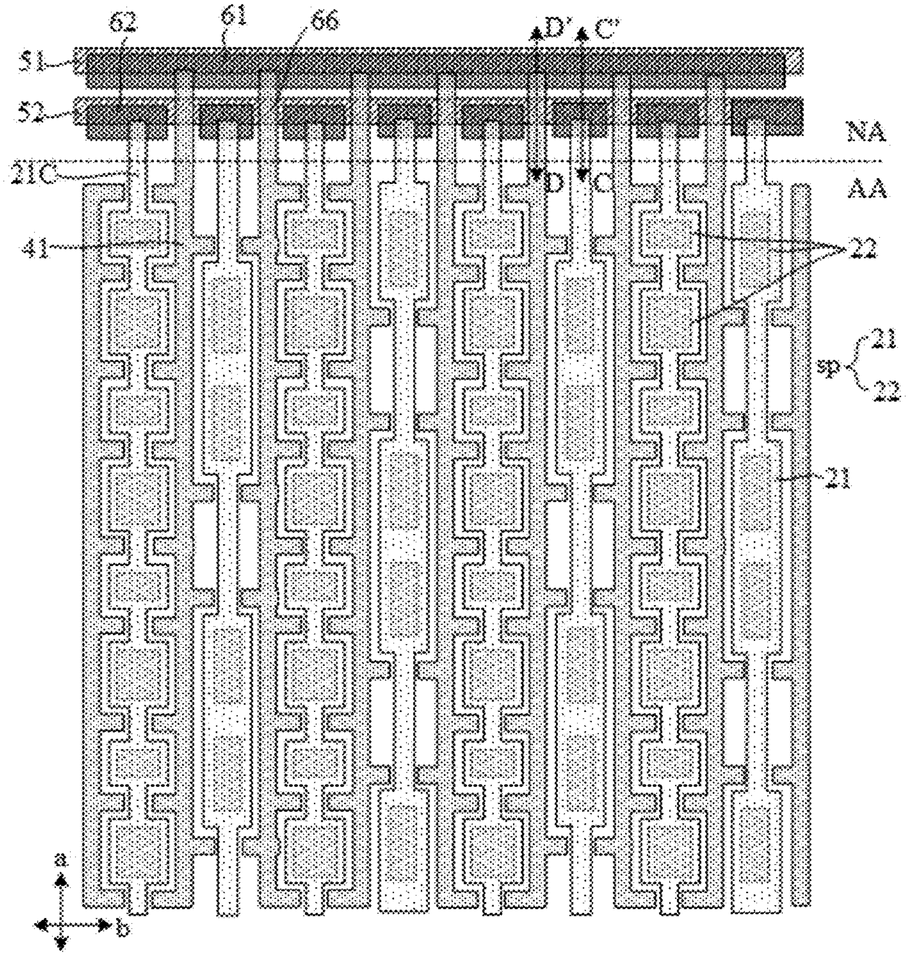
FIG. 8A is a schematic diagram of a display panel according to another embodiment of the present disclosure.

In some embodiments, FIG. 8A is a schematic diagram of a display panel according to another embodiment of the present disclosure. In addition, FIG. 8A only shows a partial position of the display panel, which shows the common electrode 21C and the first shielding structure 41 in the display region, and does not show the touch trace 31 overlapping with the first shielding structure 41. As shown in FIG. 8A, the non-display region NA of the display panel includes a first bus 51, and the first shielding structure 41 is electrically connected to the first bus 51. The first bus 51 can be used to provide voltage signals to the first shielding structure 41, or the first shielding structure 41 may be grounded using the first bus 51, so as to implement the signal shielding function of the first shielding structure 41.

As shown in FIG. 8A, the plurality of first electrodes 21 are connected to each other to form a common electrode 21C. The non-display region NA further includes a second bus 52. The common electrode 21C is electrically connected to the second bus 52. The common electrode 21C is powered by the second bus 52 during display of the display panel. The first bus 51 and the second bus 52 are located in a same layer. The second bus 52 is an original signal line for providing a signal to the first electrode 21 in the display panel. The first bus 51 and the second bus 52 are disposed in a same layer, and can be manufactured in a same process. The arrangement of the first bus 51 does not add any new manufacturing processes.

In some embodiments, as shown in FIG. 8A, the first bus 51 is located at a side of the second bus 52 away from the common electrode 21C. In other words, the first bus 51 is located at a side of the second bus 52 away from the display region AA. In this way, a distance between the second bus 52 and the common electrode 21C can be closer, so that a voltage drop of signal transmission is smaller, which is beneficial to improving the uniformity of the voltage on the first electrode 21 in the display region respectively, thereby improving the display uniformity.

As shown in FIG. 8A, the non-display region NA further includes a first overlapping portion 61 and a second overlapping portion 62. The first overlapping portion 61 and the second overlapping portion 62 are located in a same layer as the second electrode 22. The first shielding structure 41 is connected to the first bus 51 through the first overlapping portion 61, and the common electrode 21C is connected to the second bus 52 through the second overlapping portion 62. The first bus 51 and the second bus 52 are located in the circuit layer 10. In an embodiment, the first bus 51 and the second bus 52 are located in a same layer. In an embodiment of the present disclosure, the common electrode 21C is connected to the second bus 52 through the second overlapping portion 62, thereby reducing a contact resistance with the overlapping portion, and reducing a voltage drop of signal transmission, which not only can improve the voltage uniformity on the in-plane first electrode 21, but also can reduce the power consumption of the display panel. The first shielding structure 41 is connected to the first bus 51 through the first overlapping portion 61, which can also reduce the contact voltage drop and the power consumption.

Figure 8B:
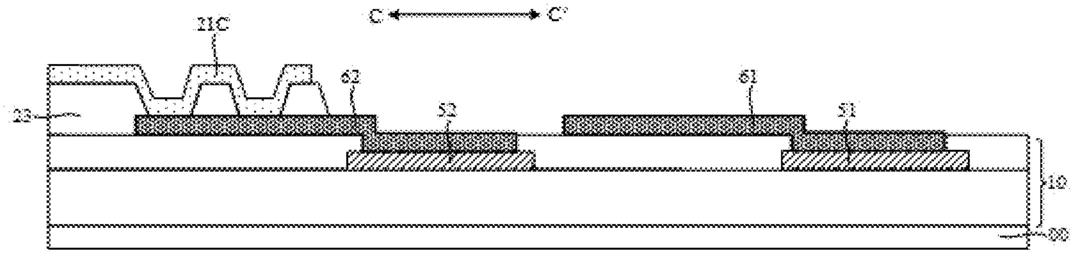
FIG. 8B is a cross-sectional view of FIG. 8A along line C-C' according to an embodiment of the present disclosure.

In an embodiment of the present disclosure, the first shielding structure 41 is electrically connected to the first bus 51 through the first overlapping portion 61. The common electrode 21C is electrically connected to the second bus 52 through the second overlapping portion 62. The specific electrical connection method can refer to the schematic diagrams in FIG. 8B and FIG. 8C. FIG. 8B is a cross-sectional view of FIG. 8A along line C-C', and FIG. 8C is a cross-sectional view of FIG. 8A along line D-D'.

As shown in FIG. 8B, a portion of the common electrode 21C extending to the non-display region is electrically connected to the second overlapping portion 62 through a via hole penetrating the pixel defining layer 23, the second bus 52 is located in the circuit layer 10, and the second overlapping portion 62 is electrically connected to the second bus 52 through a via hole penetrating the insulating layer.

Figure 8C:
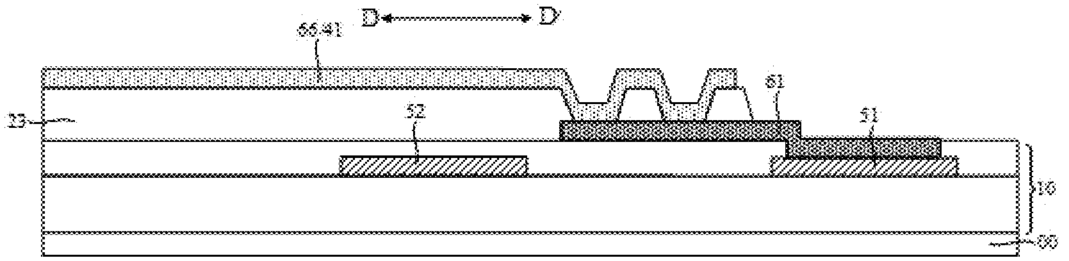
FIG. 8C is a cross-sectional view of FIG. 8A along line D-D' according to an embodiment of the present disclosure.

As shown in FIG. 8C, a portion of the first shielding structure 41 extending to the non-display region includes a third connection portion 66. The third connection portion 66 is electrically connected to the first overlapping portion 61 through the via hole penetrating the pixel defining layer 23. The first bus 51 is located in the circuit layer 10. The first overlapping portion 61 is electrically connected to the first bus 51 through the via hole penetrating the insulating layer.

In addition, in FIG. 8A, a plurality of second overlapping portions 62 separated from each other are disposed in the non-display region NA. The third connection portion 66 extending from the first shielding structure 41 to the non-display region NA is traced between the two second overlapping portions 62. The third connection portion 66 is connected to the first shielding structure 41 in the display region AA and the first overlapping portion 61 in the non-display region NA. In another embodiment, the plurality of common electrodes 21C are connected to one first overlapping portion 61. The first overlapping portion 61 is insulated and intersected with the third connection portion 66, which will not be illustrated here.

Figure 9:
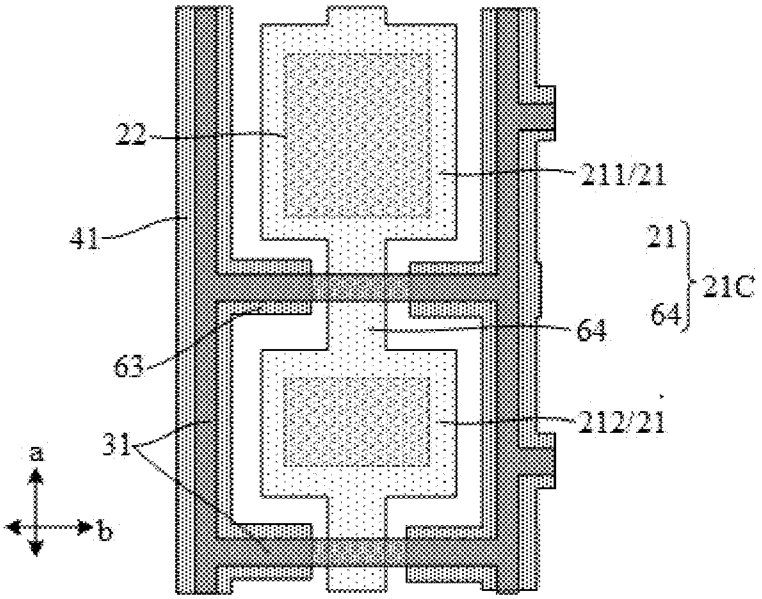
FIG. 9 is an enlarged view of a region Q in FIG. 2 according to an embodiment of the present disclosure.

In some embodiments, FIG. 9 is an enlarged view of a region Q in FIG. 2 according to an embodiment of the present disclosure. As shown in FIG. 9, adjacent first electrodes 21 in the common electrode 21C include a first sub-electrode 211 and a second sub-electrode 212. The first sub-electrode 211 and the second sub-electrode 212 are connected through a first connection portion 64. At least one touch trace 31 is insulated and intersected with the first connection portion 64. The first shielding structure 41 includes an extension portion 63. The extension portion 63 is located between the first sub-electrode 211 and the second sub-electrode 212. Two extension portions 63 are respectively located at two sides of the first connection portion 64. The extension portion 63 overlaps with the touch trace 31. In this embodiment, the electrical connection between two adjacent first electrodes 21 is realized with the first connection portion 64, and the extension portion 63 of the first shielding structure 41 is extended between two adjacent first electrodes 21, thereby increasing the overlapping region of the first shielding structure 41 and the touch trace 31, and thus improving the signal shielding capability of the first shielding structure 41.

Figure 10:
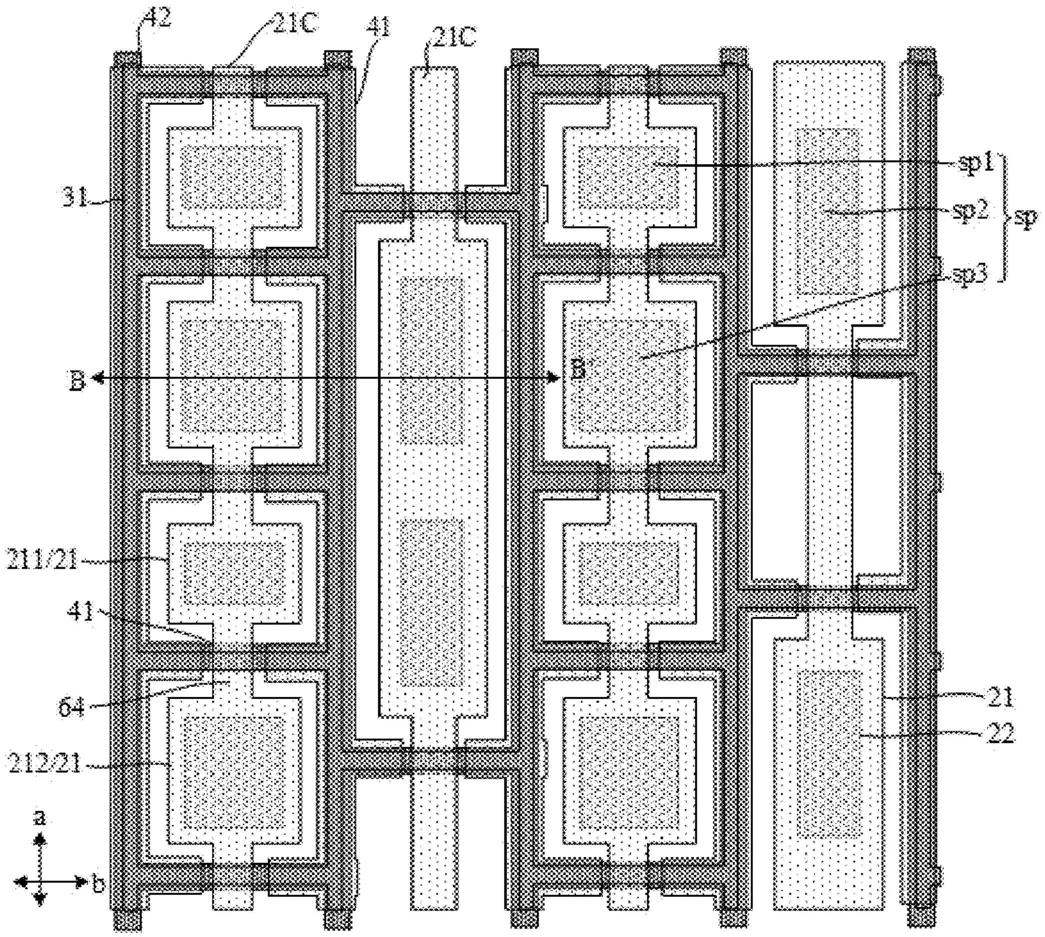
FIG. 10 is a schematic diagram of a display panel according to another embodiment of the present disclosure.
Figure 11:
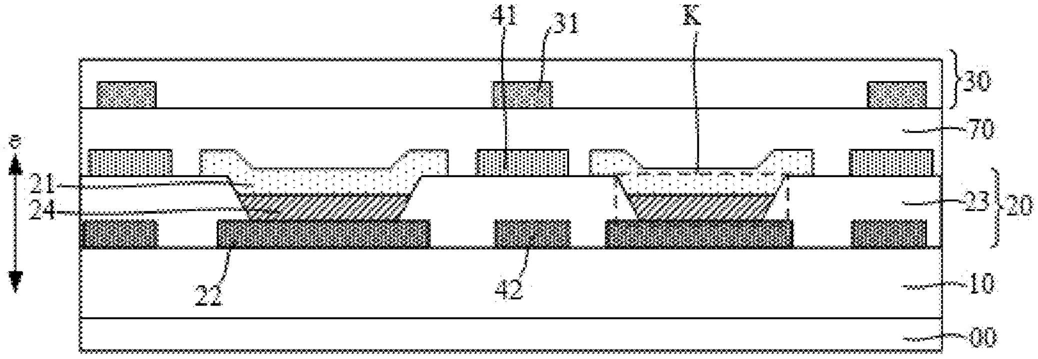
FIG. 11 is a cross-sectional view of FIG. 10 along line B-B' according to an embodiment of the present disclosure.
Figure 12:
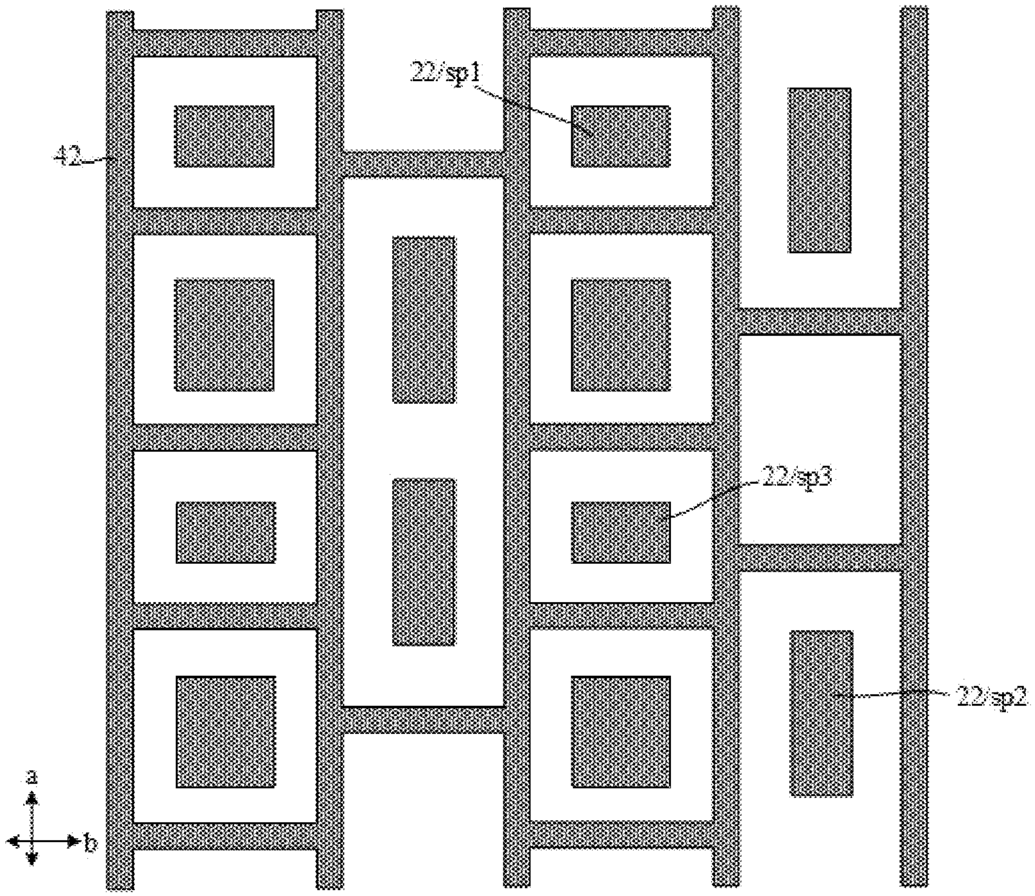
FIG. 12 is a schematic diagram of a display panel according to another embodiment of the present disclosure.

In some embodiments, FIG. 10 is a schematic diagram of a display panel according to another embodiment of the present disclosure. FIG. 11 is a cross-sectional view of FIG. 10 along line B-B' according to an embodiment of the present disclosure. FIG. 12 is a schematic diagram of a display panel according to another embodiment of the present disclosure, and FIG. 12 illustrates a pattern of a film layer of the second electrode 22 and the second shielding structure 42 in FIG. 10. Referring to FIG. 10 to FIG. 12, the display panel further includes a second shielding structure 42, and the second shielding structure 42 and the second electrode 22 are located in a same layer. Along the direction perpendicular to the plane of the substrate 00, the second shielding structure 42 at least partially overlaps with the touch trace 31. In this embodiment, the first shielding structure 41 is disposed in a same layer as the first electrode 21. The second shielding structure 42 is disposed in a same layer as the second electrode 22. The first shielding structure 41 and the second shielding structure 42 can jointly play a role in shielding signals between the circuit layer 10 and the touch trace 31. The shielding structure manufactured in the two film layers improves the signal shielding capability. In addition, the first shielding structure 41 and the second shielding structure 42 are respectively located in a same layer as the original structure in the display panel, and there is no additional manufacturing process during production.

As shown in FIG. 10, at least two interconnected first electrodes 21 form the common electrode 21C. Adjacent first electrodes 21 in the common electrode 21C include a first sub-electrode 211 and a second sub-electrode 212. The first sub-electrode 211 and the second sub-electrode 212 are connected through a first connection portion 64. As can be seen from FIG. 10, at least one first touch trace 31 is insulated and intersected with the first connection portion 64, and the second shielding structure 42 is insulated and intersected with the first connection portion 64. Since the second shielding structure 42 and the second electrodes 22 are located in a same layer, and the plurality of second electrodes 22 of the plurality of sub-pixels in the display panel are isolated from each other, the second shielding structure 42 can be manufactured relatively freely between adjacent second electrodes 22. As shown in FIG. 12, the second shielding structure 42 is arranged between adjacent second electrodes 22, and is a mesh structure integrally. Then, at the position where the first shielding structure 41 isolates from the first connection portion 64, the second shielding structure 42 is insulated and intersected with the first connection portion 64. Therefore, the second shielding structure 42 can be disposed to overlap with the touch trace 31 at a position where the first shielding structure 41 cannot overlap with the touch trace 31, so as to shield the signal between the touch trace 31 and the circuit layer 10 with the second shielding structure 42. The second shielding structure 42 cooperates with the first shielding structure 41 to manufacture a tighter shielding structure, thereby improving the signal shielding capability.

Figure 13:
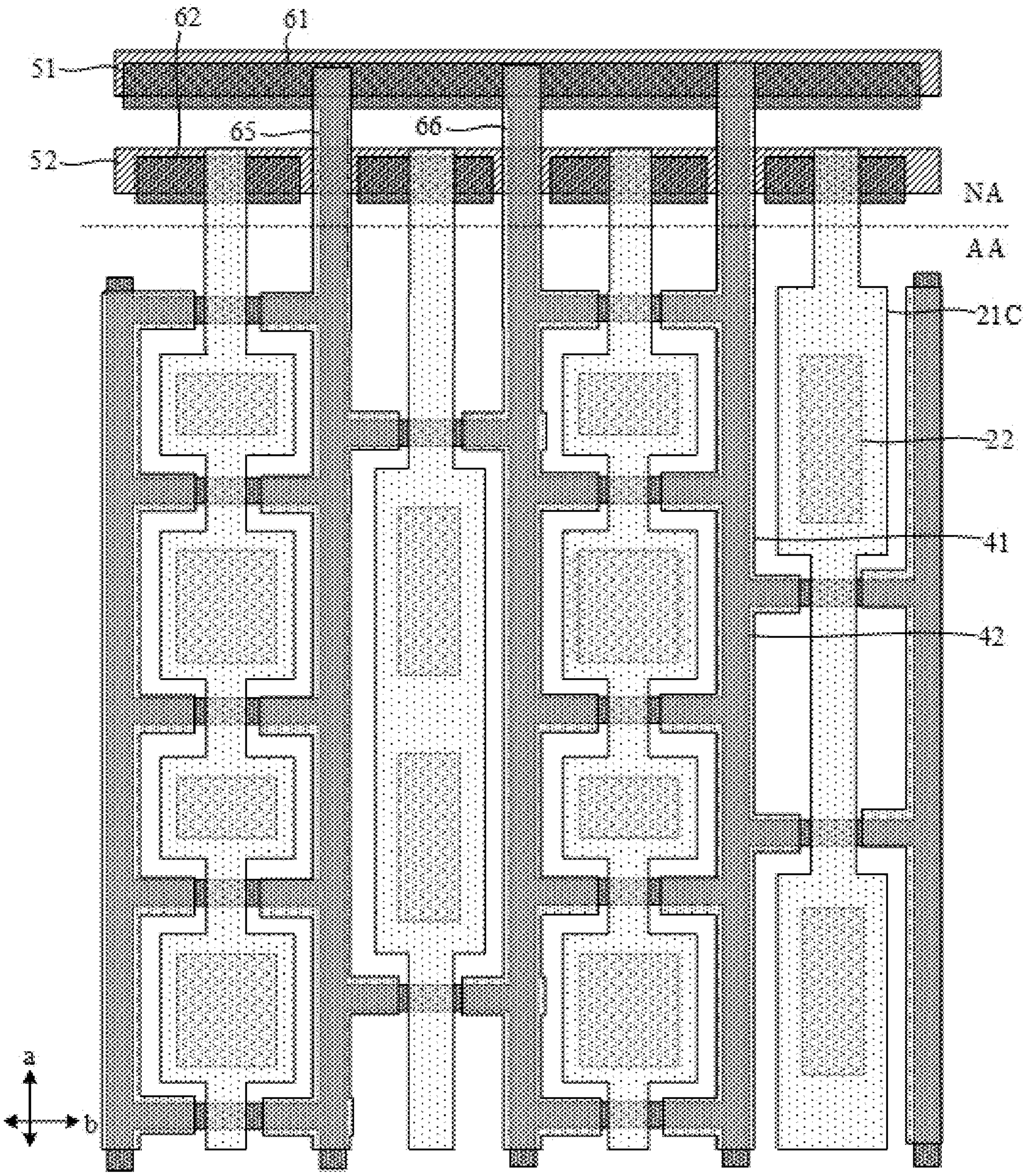
FIG. 13 is a schematic diagram of a display panel according to another embodiment of the present disclosure.

In some embodiments, FIG. 13 is a schematic diagram of a display panel according to another embodiment of the present disclosure. FIG. 13 only shows a partial position of the display panel, and shows the common electrode 21C, the first shielding structure 41 and the second shielding structure 42 in the display region AA, while does not show the touch trace 31 overlapping with the first shielding structure 41. As shown in FIG. 13, the non-display region NA of the display panel includes a first bus 51, and the second shielding structure 42 is electrically connected to the first bus 51. The first bus 51 can be used to provide voltage signals to the second shielding structure 42, or the second shielding structure 42 may be grounded using the first bus 51, so as to implement the signal shielding function of the second shielding structure 42.

As shown in FIG. 13, the non-display region NA further includes a first overlapping portion 61. The first shielding structure 41 is connected to the first bus 51 through the first overlapping portion 61. The second shielding structure 42 is connected to the first bus 51 through the first overlapping portion 61. The first overlapping portion 61 and the second shielding structure 42 are located in a same layer. In this embodiment, only one first bus 51 is provided to be electrically connected to the first shielding structure 41 and the second shielding structure 42 respectively, so as to realize the signal shielding function, thereby reducing the number of signal lines provided in the non-display region NA, and thus being beneficial to saving the space of the non-display region. In addition, the first overlapping portion 61 and the second shielding structure 42 are located in a same layer. That is, the first overlapping portion 61, the second shielding structure 42, and the second electrode 22 can be manufactured in a same process without adding a new process, which is beneficial to saving the manufacturing cost.

As shown in FIG. 13, the non-display region NA further includes a second bus 52 and a second overlapping portion 62. The second bus 52 and the first bus 51 are located in a same layer. The second overlapping portion 62 and the first overlapping portion 61 are located in a same layer. The common electrode 21C is connected to the second bus 52 through the second overlapping portion 62. The first bus 51 is located at a side of the second bus 52 away from the common electrode. The way in which the common electrode 21C is connected to the second bus 52 through the second overlapping portion 62, can refer to the schematic diagram of FIG. 8B, which is only simplified in FIG. 13. The non-display region NA further includes a second connection portion 65. The second connection portion 65 and the second shielding structure 42 are located in a same layer. The second shielding structure 42 is connected to the first overlapping portion 61 through the second connection portion 65. A portion of the first shielding structure 41 extending to the non-display region includes a third connection portion 66. The third connection portion 66 is connected to the first overlapping portion 61. In an embodiment, the third connection portion 66 at least partially overlaps with the second connection portion 65. The second overlapping portion 62 is disconnected at a position of the second connection portion 65. In an embodiment of the present disclosure, the first shielding structure 41 and the second shielding structure 42 are electrically connected to the first bus 51. The common electrode 21C is electrically connected to the second bus 52. The second overlapping portion 62 connected to the common electrode 21C is disconnected at the position of the second connection portion 65. By reasonably designing the relative positions of overlapping portion and connection portion respectively, it is possible to reuse the original film layer of the display panel to manufacture new structures such as the overlapping portion and the connection portion, thereby ensuring normal power supply to the common electrode 21C in the display region AA. In addition, the first shielding structure 41 and the second shielding structure 42 can be grounded, or shielding signals can be provided to the first shielding structure 41 and the second shielding structure 42, thereby achieving the signal shielding function.

In an embodiment of the present disclosure, the first shielding structure 41 and the common electrode 21C are located in a same layer. During manufacturing, an entire electrode layer may be manufactured, and then required patterns of the first shielding structure 41 and the common electrode 21C are etched by an etching process. In some other embodiments, an isolation structure may also be formed in the display panel, and an electrode layer formed in the whole layer may be partitioned by the isolation structure to form required patterns of the first shielding structure 41 and the common electrode 21C.

Figure 14:
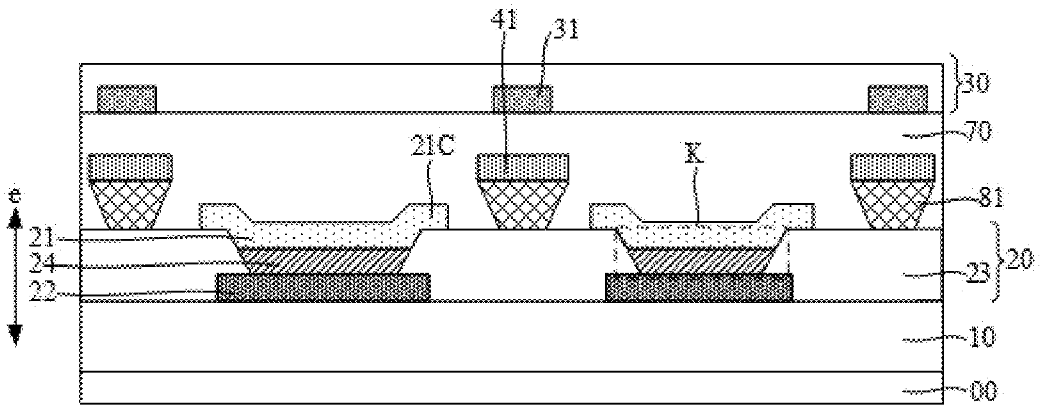
FIG. 14 is a cross-sectional view of FIG. 2 along line A-A' according to another embodiment of the present disclosure.

In some embodiments, FIG. 14 is a cross-sectional view of FIG. 2 along line A-A' according to an embodiment of the present disclosure. As shown in FIG. 14, the display layer 20 further includes a first isolation structure 81. The first isolation structure 81 protrudes towards a side away from the substrate 00. An area of a side of the first isolation structure 81 away from the substrate 00 is greater than an area of a side close to the substrate 00. The first isolation structure 81 is located at a side of the pixel definition layer 23 away from the substrate 00. At least two interconnected first electrodes 21 form the common electrode 21C. The common electrode 21C and the first shielding structure 41 are disconnected at the position of the first isolation structure 81.

Figure 15:
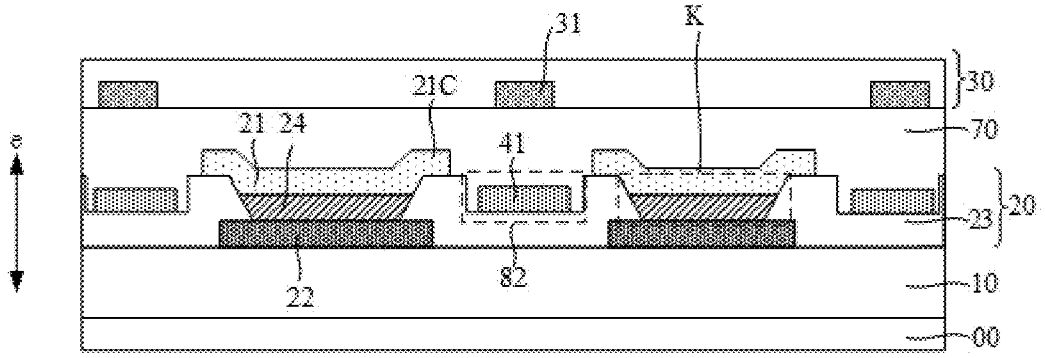
FIG. 15 is a cross-sectional view of FIG. 2 along line A-A' according to another embodiment of the present disclosure.

In some embodiments, FIG. 15 is a cross-sectional view of FIG. 2 along line A-A' according to an embodiment of the present disclosure. As shown in FIG. 15, the display layer 20 further includes a second isolation structure 82. The second isolation structure 82 is recessed toward a side close to the substrate 00 to form a trench. At least two interconnected first electrodes 21 form the common electrode 21C. The common electrode 21C and the first shielding structure 41 are disconnected at the position of the second isolation structure 82. In an embodiment, an opening area of the trench of the second isolation structure 82 is less than or equal to a bottom area of the trench of the second isolation structure 82. In an embodiment, the second isolation structure 82 is formed on the pixel defining layer 23. The second isolation structure 82 and the opening K are formed simultaneously when forming the pixel definition layer 23.

Figure 16:
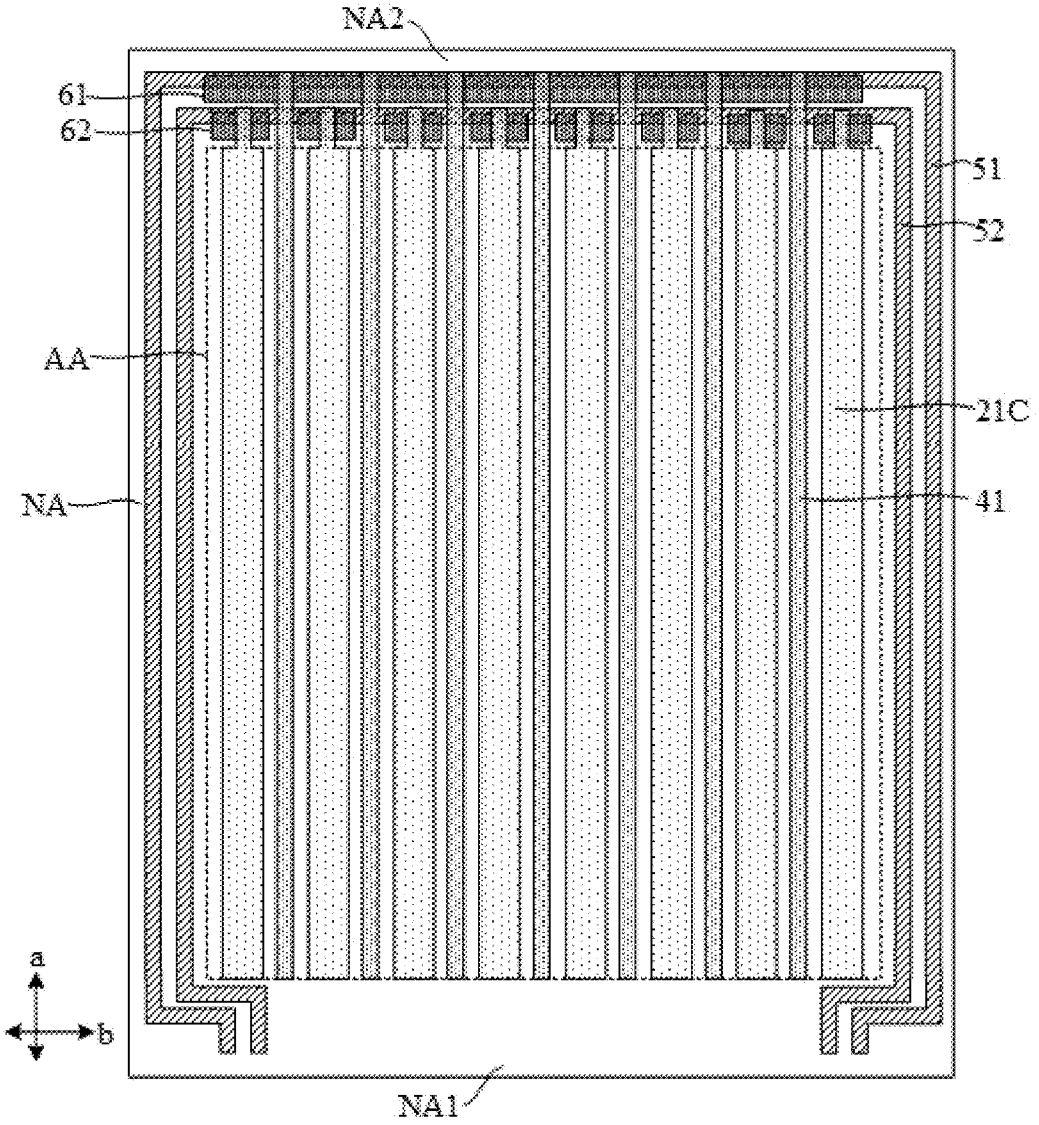
FIG. 16 is a schematic diagram of a display panel according to another embodiment of the present disclosure.

FIG. 8A and FIG. 13 illustrate that a first bus 51 and a second bus are disposed in the non-display region NA. In order to more clearly illustrate the wiring situation of the non-display region NA, an embodiment of the present disclosure further provides another wiring schematic diagram. FIG. 16 is a schematic diagram of a display panel according to another embodiment of the present disclosure, and shapes of the first shielding structure 41 and the common electrode 21C in the display region AA are simplified in FIG. 16. As shown in FIG. 16, the non-display region NA of the display panel surrounds the display region AA. The non-display region NA includes a first non-display region NA1 and a second non-display region NA2. A plurality of signal terminals (not shown in FIG. 16) are disposed in the first non-display region NA1. The signal terminals are configured to be connected to the circuit board. The signal terminals are configured to receive signals and provide the signals to circuits in the circuit layer 10 of the display panel, so as to drive the display panel to display. The first bus 51 and the second bus 52 are respectively led out from the first non-display region NA1, and disposed around the display region AA. In addition, the first bus 51 and the second bus 52 are respectively connected to corresponding signal terminals in the first non-display region NA1. An extension direction of the common electrode 21C and the first shielding structure 41 is a first direction a. The first non-display region NA1 and the second non-display region NA2 are located at two sides of the display region AA along the first direction a. A first overlapping portion 61 and a second overlapping portion 62 are disposed in the second non-display region NA2. The first shielding structure 41 is connected to the first bus 51 through the first overlapping portion 61. The common electrode 21C is connected to the second bus 52 through the second overlapping portion 62. The first non-display region NA1 is a lower frame region of the display panel, and the second non-display region NA2 is an upper frame region of the display panel. Additionally, shift driving circuits are usually disposed in the non-display regions NA on both sides in FIG. 16. In this embodiment of the present disclosure, both the first overlapping portion 61 and the second overlapping portion 62 are provided in the second non display region NA2, which will not affect widths of the left and right frames of the display panel.

Figure 17:
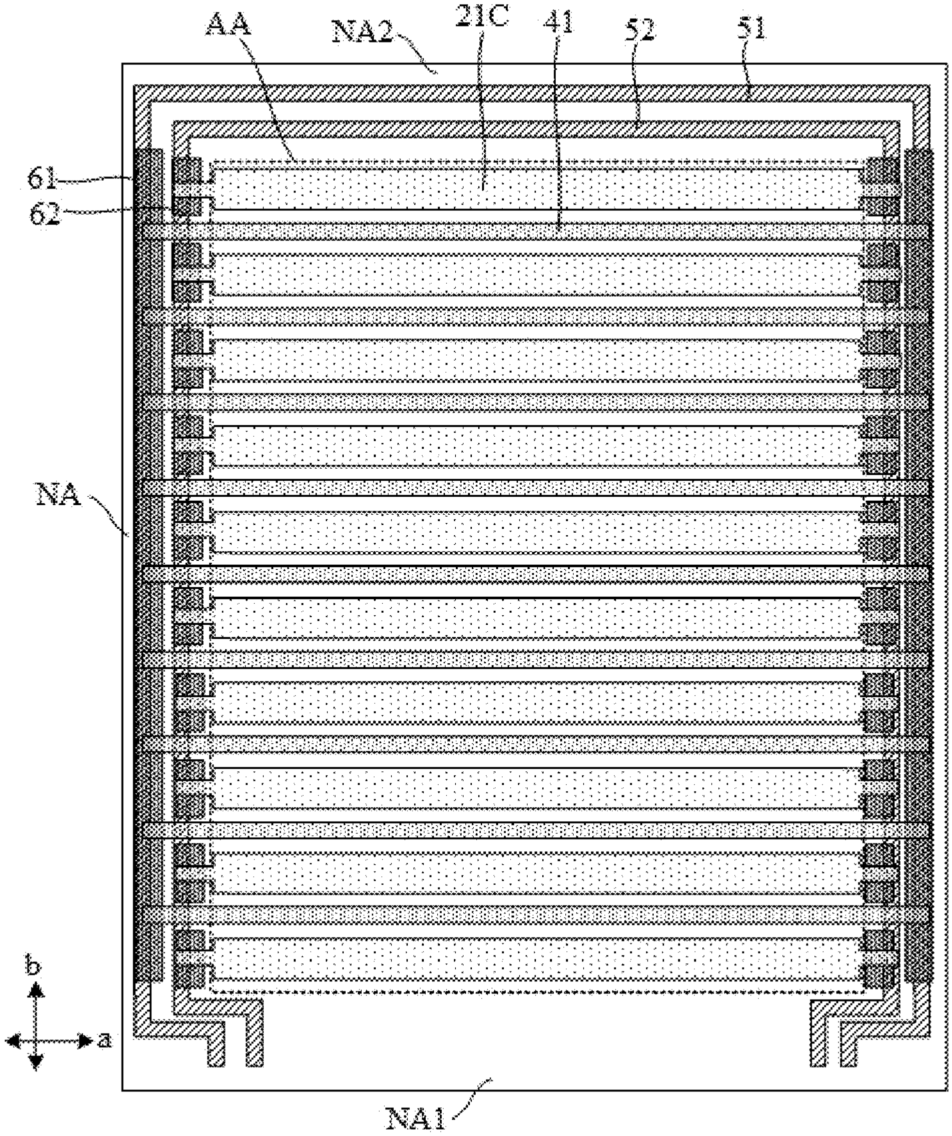
FIG. 17 is a schematic diagram of a display panel according to another embodiment of the present disclosure.

In another embodiment, FIG. 17 is a schematic diagram of a display panel according to another embodiment of the present disclosure. As shown in FIG. 17, an extending direction of the common electrode 21C and the first shielding structure 41 is a first direction a. The first non-display region NA1 and the second non-display region NA2 are located at two sides of the display region AA along the second direction b. The first direction a intersect with the second direction b. A plurality of signal terminals (not shown in FIG. 17) are disposed in the first non-display region NA1. The first bus 51 and the second bus 52 are respectively led out from the first non-display region NA1, and disposed around the display region AA. The first overlapping portion 61 and the second overlapping portion 62 are disposed in the non-display region NA on both sides of the display region AA along the first direction a. The first shielding structure 41 is connected to the first bus 51 through the first overlapping portion 61. The common electrode 21C is connected to the second bus 52 through the second overlapping portion 62.

Figure 18:
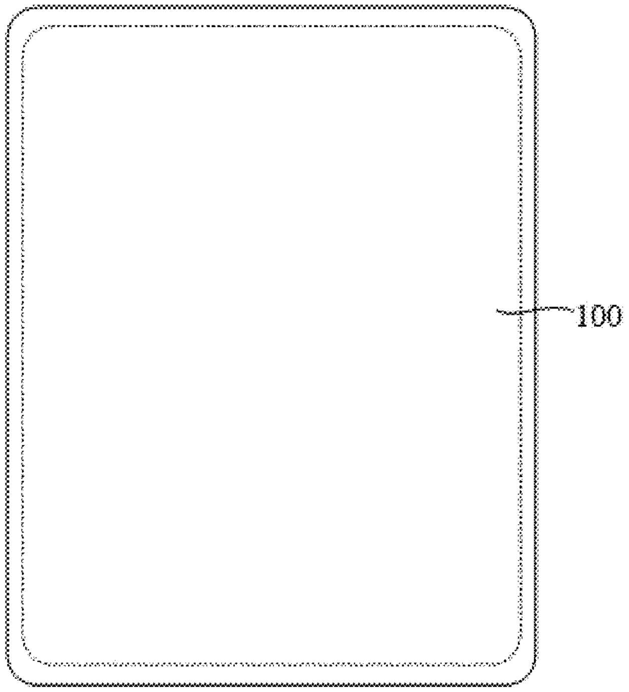
FIG. 18 is a schematic diagram of a display apparatus according to an embodiment of the present disclosure.

Based on the same inventive concept, an embodiment of the present disclosure further provides a display apparatus. FIG. 18 is a schematic diagram of a display apparatus according to an embodiment of the present disclosure. As shown in FIG. 18, the display apparatus includes the display panel 100 provided by any embodiment of the present disclosure. The structure of the display panel 100 has been described in the above embodiments, and will not be repeated here. The display apparatus provided by the embodiments of the present disclosure may be, for example, an electronic device having a display function, such as a mobile phone, a tablet, a computer, a television, and a smart wearable product.

Figure 19:
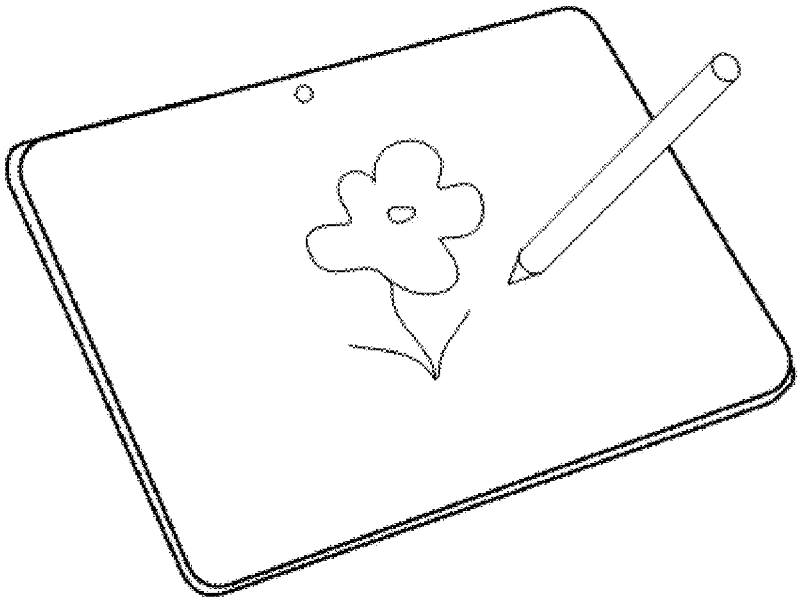
FIG. 19 is a schematic diagram showing application of a display apparatus according to an embodiment of the present disclosure.

FIG. 19 is a schematic diagram showing application of a display apparatus according to an embodiment of the present disclosure. As shown in FIG. 19, the display apparatus is a tablet computer, which can use a stylus to perform touch operations on the tablet computer to achieve interactive applications such as painting on the tablet computer.

The above description is only a preferred embodiment of the present disclosure and is not intended to limit the present disclosure, and any modifications, equivalent substitutions, improvements and the like made within the spirit and principle of the present disclosure should be included within the protection scope of the present disclosure.

Finally, it should be noted that, the above embodiments are merely used to illustrate the technical solutions of the present disclosure, but not to limit the same. Although the present disclosure has been described in detail with reference to the above embodiments, those skilled in the art should understand that the technical solutions described in the above embodiments of the present disclosure may still be modified, or some or all of the technical features may be equivalently replaced. These modifications or substitutions do not make the essence of the corresponding technical solutions depart from the scope of the technical solutions in the embodiments of the present disclosure.

What is claimed is:

1. A display panel, comprising:

a substrate; and a circuit layer, a display layer, a touch layer and a first shielding structure that are located at a side of the substrate;

wherein the display layer is located at a side of the circuit layer away from the substrate; the display layer comprises a pixel definition layer, first electrodes and second electrodes, the pixel definition layer comprises openings exposing the second electrodes, and at least part of the first electrodes is located in the openings; the touch layer is located at a side of the display layer away from the substrate; the touch layer comprises a touch trace, and the touch trace overlaps with the pixel definition layer along a direction perpendicular to a plane of the substrate; and wherein the first shielding structure and the first electrodes are located in a same layer; and the first shielding structure at least partially overlaps with the touch trace along the direction perpendicular to the plane of the substrate.

2. The display panel according to claim 1, further comprising a non-display region, wherein the non-display region comprises a first bus electrically connected to the first shielding structure.

3. The display panel according to claim 2, wherein at least two interconnected first electrodes form a common electrode;

the non-display region comprises a second bus electrically connected to the common electrode; and the first bus and the second bus are located in a same layer.

4. The display panel according to claim 3, wherein the first bus is located at a side of the second bus away from the common electrode.

5. The display panel according to claim 3, wherein the non-display region further comprises a first overlapping portion and a second overlapping portion, and the first overlapping portion and the second overlapping portion are located in a same layer as the second electrode; and the first shielding structure is connected to the first bus through the first overlapping portion, and the common electrode is connected to the second bus through the second overlapping portion.

6. The display panel according to claim 3, wherein adjacent first electrodes in the common electrode comprise a first sub-electrode and a second sub-electrode, and the first sub-electrode is connected to the second sub-electrode through a first connection portion;

at least one touch trace is insulated from and intersected with the first connection portion; and the first shielding structure comprises an extension portion located between the first sub-electrode and the second sub-electrode, and two extension portions are respectively located at two sides of the first connection portion.

7. The display panel according to claim 1, wherein at least two interconnected first electrodes form a common electrode; and the common electrode and the first shielding structure extend along a first direction respectively, the common electrode and the first shielding structure are alternately arranged along a second direction, the first direction and the second direction are parallel to the substrate respectively, and the first direction intersects with the second direction.

8. The display panel according to claim 7, wherein the circuit layer comprises a data line and a scan line, one of the data line and the scan line extends along the first direction, and another one of the data line and the scan line extends along the second direction.

9. The display panel according to claim 1, further comprising a second shielding structure, wherein the second shielding structure and the second electrode are located in a same layer; and the second shielding structure at least partially overlaps with the touch trace along the direction perpendicular to the plane of the substrate.

10. The display panel according to claim 9, further comprising a non-display region, wherein the non-display region comprises a first bus, and the first shielding structure is electrically connected to the first bus.

11. The display panel according to claim 10, wherein the non-display region further comprises a first overlapping portion, the first shielding structure is connected to the first bus through the first overlapping portion, the second shielding structure is connected to the first bus through the first overlapping portion, and the first overlapping portion and the second shielding structure are located in a same layer.

12. The display panel according to claim 11, wherein at least two interconnected first electrodes form a common electrode; and the non-display region further comprises a second bus and a second overlapping portion, the second bus and the first bus are located in a same layer, the second overlapping portion and the first overlapping portion are located in a same layer, the common electrode is connected to the second bus through the second overlapping portion, and the first bus is located at a side of the second bus away from the common electrode;

the non-display region further comprises a second connection portion, the second connection portion and the second shielding structure are located in a same layer, and the second shielding structure is connected to the first overlapping portion through the second connection portion; and the second overlapping portion is disconnected at a position of the second connection portion.

13. The display panel according to claim 10, wherein at least two interconnected first electrodes form a common electrode; adjacent first electrodes in the common electrode comprise a first sub-electrode and a second sub-electrode, and the first sub-electrode is connected to the second sub-electrode through a first connection portion; and at least one touch trace is insulated from and intersected with the first connection portion, and the second shielding structure is insulated from and intersected with the first connection portion.

14. The display panel according to claim 1, wherein the display layer further comprises an isolation structure; at least two interconnected first electrodes form a common electrode, and the common electrode and the first shielding structure are disconnected at a position of the isolation structure.

15. A display apparatus, comprising a display panel, wherein the display panel comprises:

a substrate; and a circuit layer, a display layer, a touch layer and a first shielding structure that are located at a side of the substrate;

wherein the display layer is located at a side of the circuit layer away from the substrate; the display layer comprises a pixel definition layer, first electrodes and second electrodes, the pixel definition layer comprises openings exposing the second electrodes, and at least part of the first electrodes is located in the openings; the touch layer is located at a side of the display layer away from the substrate; the touch layer comprises a touch trace, and the touch trace overlaps with the pixel definition layer along a direction perpendicular to a plane of the substrate; and wherein the first shielding structure and the first electrodes are located in a same layer; and the first shielding structure at least partially overlaps the touch trace along the direction perpendicular to the plane of the substrate.

16. The display apparatus according to claim 15, further comprising a non-display region, wherein the non-display region comprises a first bus electrically connected to the first shielding structure.

17. The display apparatus according to claim 16, wherein at least two interconnected first electrodes form a common electrode;

the non-display region comprises a second bus electrically connected to the common electrode; and the first bus and the second bus are located in a same layer.

18. The display apparatus according to claim 15, wherein at least two interconnected first electrodes form a common electrode; and the common electrode and the first shielding structure extend along a first direction respectively, the common electrode and the first shielding structure are alternately arranged along a second direction, the first direction and the second direction are parallel to the substrate respectively, and the first direction intersects with the second direction.

19. The display apparatus according to claim 15, further comprising a second shielding structure, wherein the second shielding structure and the second electrode are located in a same layer; and the second shielding structure at least partially overlaps with the touch trace along the direction perpendicular to the plane of the substrate.

20. The display apparatus according to claim 15, wherein the display layer further comprises an isolation structure;

at least two interconnected first electrodes form a common electrode, and the common electrode and the first shielding structure are disconnected at a position of the isolation structure.

* * * * *